(12) United States Patent
Park et al.

(10) Patent No.: US 8,213,478 B2
(45) Date of Patent: Jul. 3, 2012

(54) LASER DEVICE

(75) Inventors: Kyung Hyun Park, Daejeon (KR); Namje Kim, Daejeon (KR); Young Ahn Leem, Daejeon (KR); Sang-Pil Han, Daejeon (KR); Chul-Wook Lee, Daejeon (KR); Jaeheon Shin, Daejeon (KR); Eundeok Sim, Daejeon (KR); Yongsoon Baek, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 73 days.

(21) Appl. No.: 12/856,172

(22) Filed: Aug. 13, 2010

(65) Prior Publication Data
US 2011/0150018 A1 Jun. 23, 2011

(30) Foreign Application Priority Data
Dec. 17, 2009 (KR) .................. 10-2009-0126310

(51) Int. Cl.
*H01S 5/00* (2006.01)

(52) U.S. Cl. .................................... 372/50.11
(58) Field of Classification Search .................. 977/755, 977/951; 372/34; 359/245
See application file for complete search history.

(56) References Cited

U.S. PATENT DOCUMENTS 7,174,070 B2 * 2/2007 Kim et al. ............... 385/37
7,983,318 B2 * 7/2011 Hayakawa .............. 372/50.11

FOREIGN PATENT DOCUMENTS
KR 10-2005-0059638 A 6/2005

* cited by examiner

*Primary Examiner* — Jessica Stultz
*Assistant Examiner* — Tuan Nguyen
(74) *Attorney, Agent, or Firm* — Rabin & Berdo, P.C.

(57) ABSTRACT

Provided is a laser device. In the laser device, an active layer is connected to a stem core of a 1×2 splitter on a substrate, a first diffraction grating is coupled to a first twig core of the 1×2 splitter, and a second diffraction grating is coupled to a second twig core of the 1×2 splitter. An active layer-micro heater is designed to supply heat to the active layer. First and second micro heaters are designed to supply heats to the first and second diffraction gratings, respectively, thereby varying a Bragg wavelength.

15 Claims, 20 Drawing Sheets

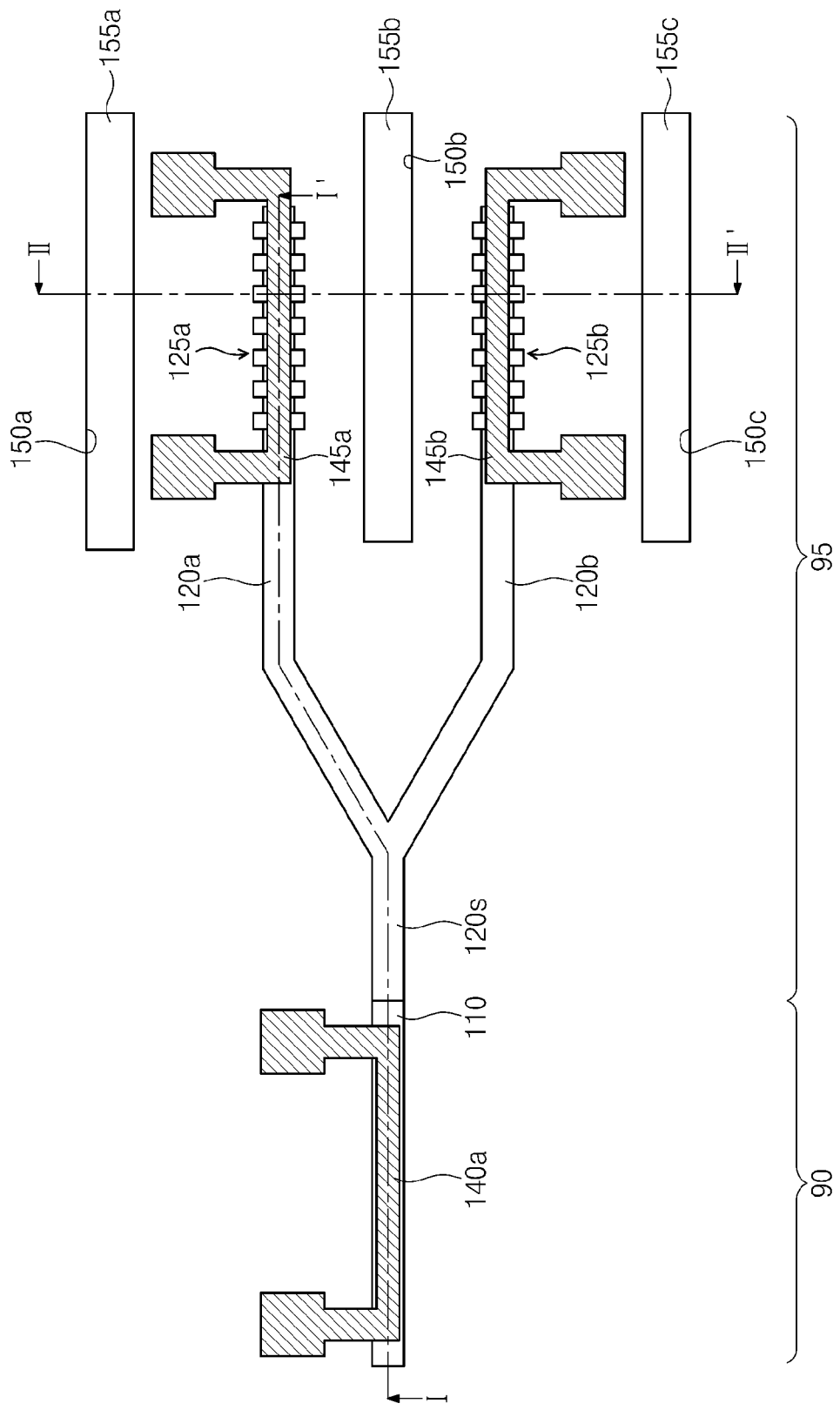

Fig. 3
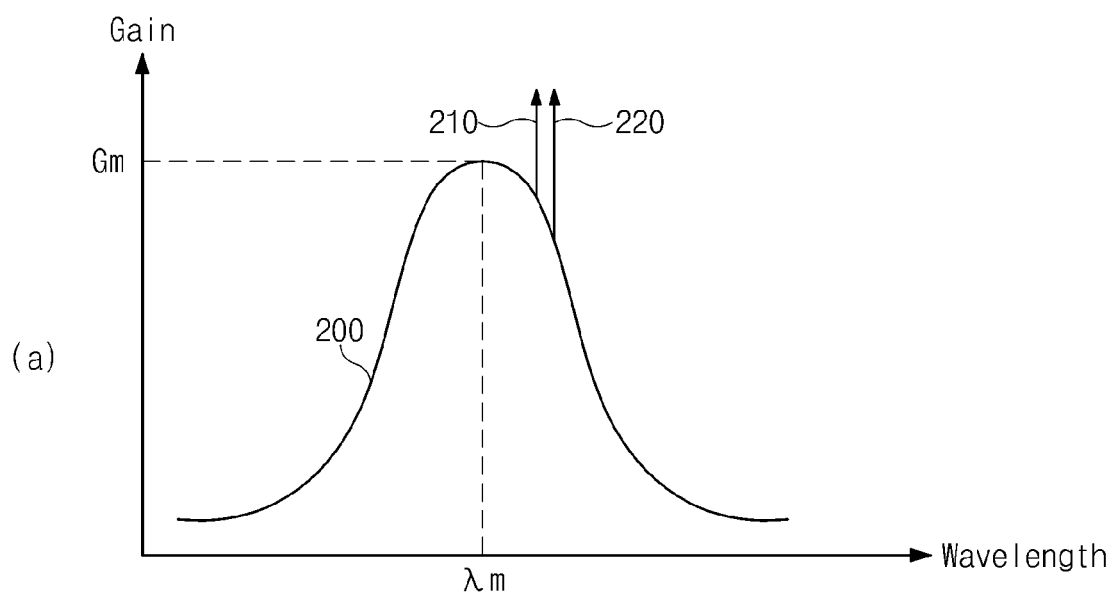
(a)
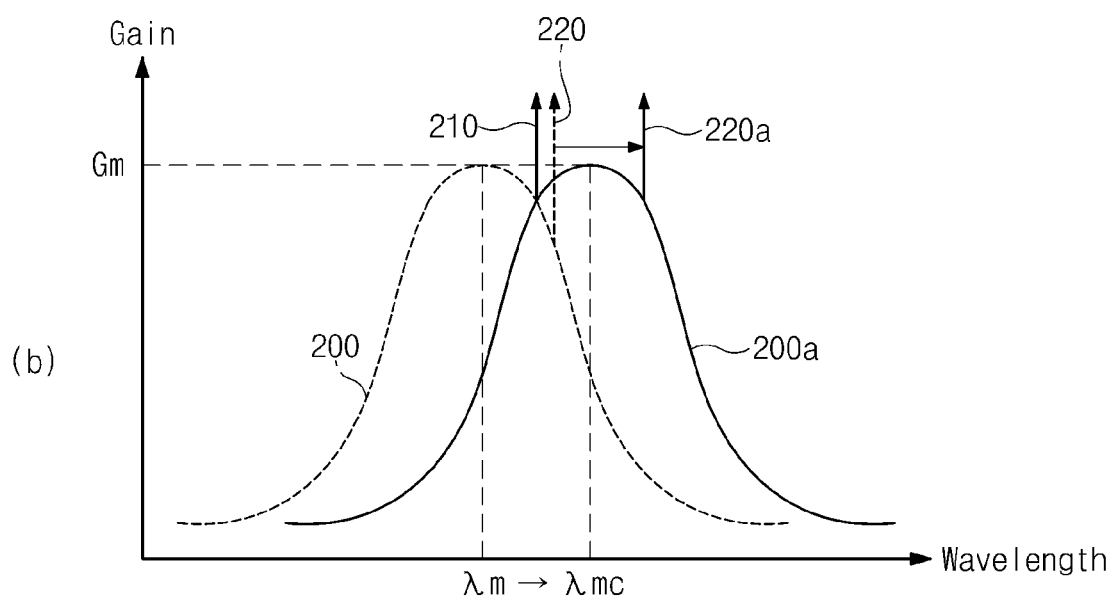
(b)

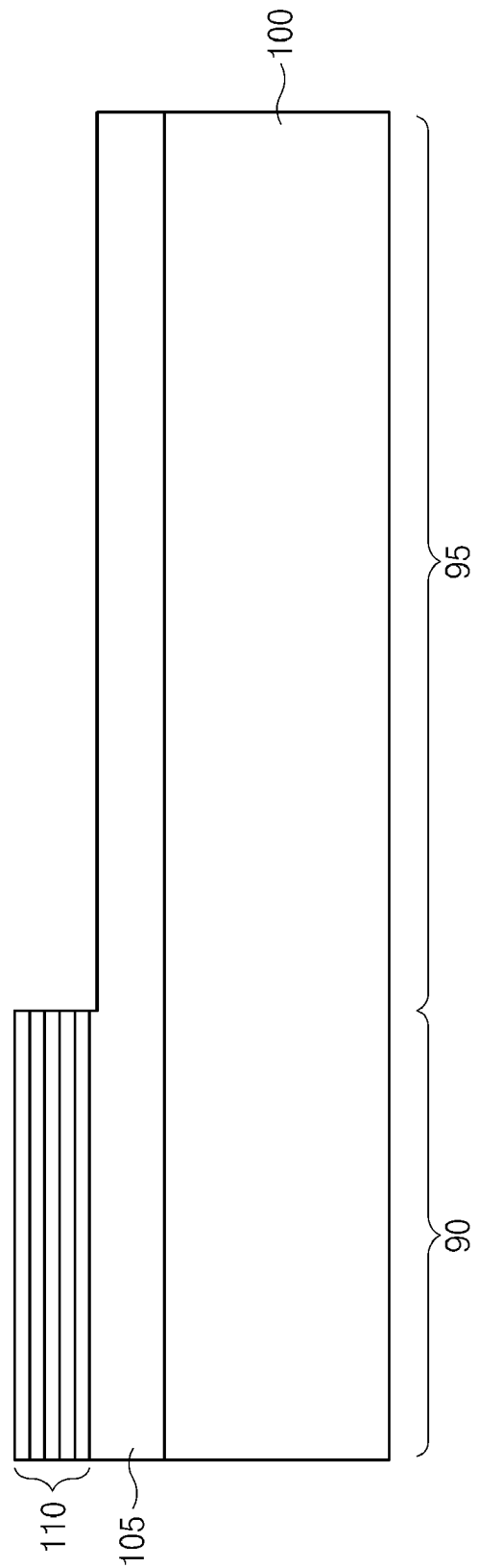

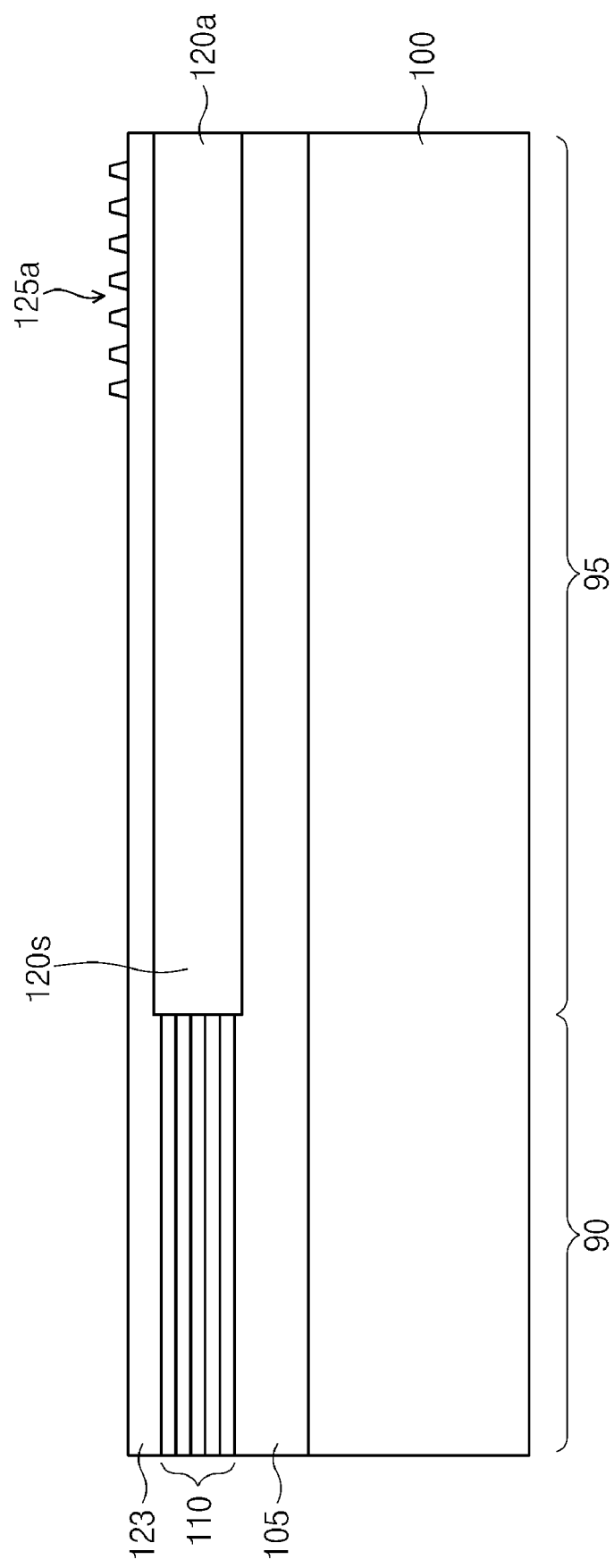

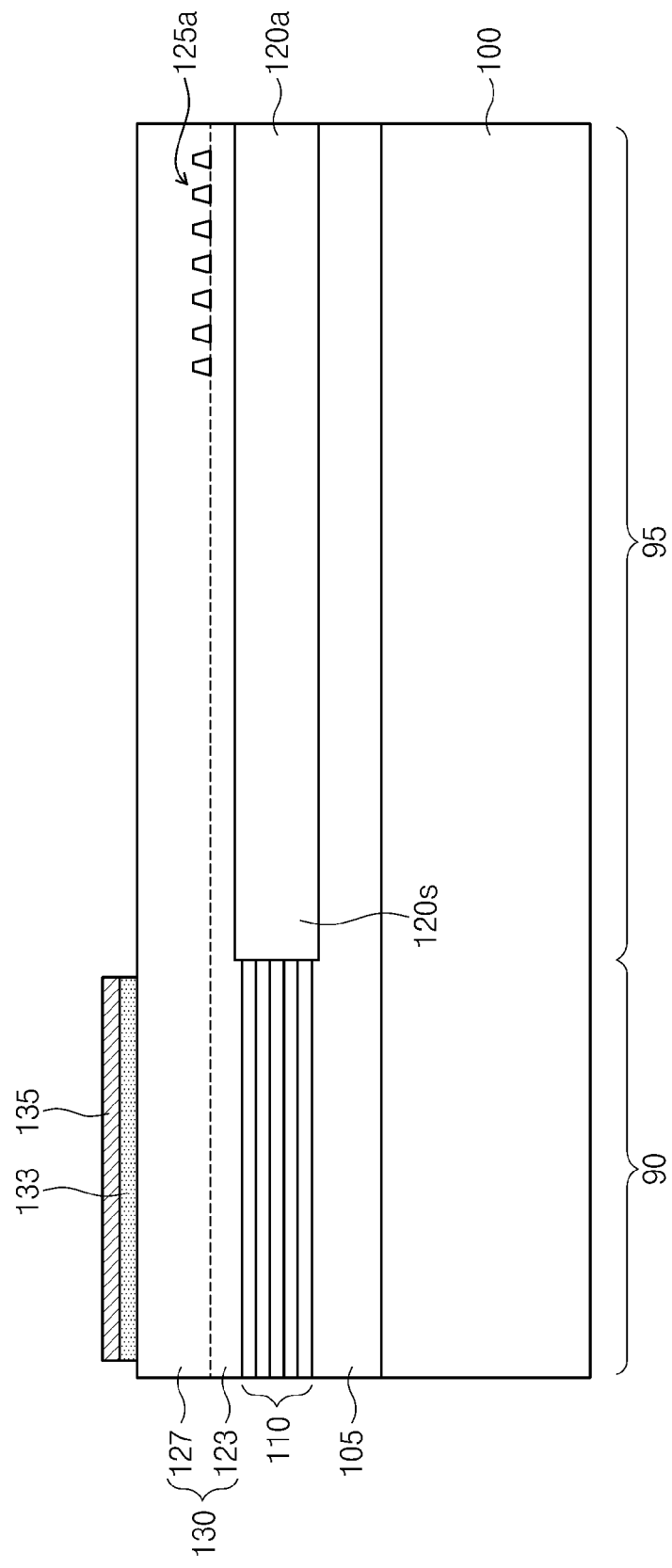

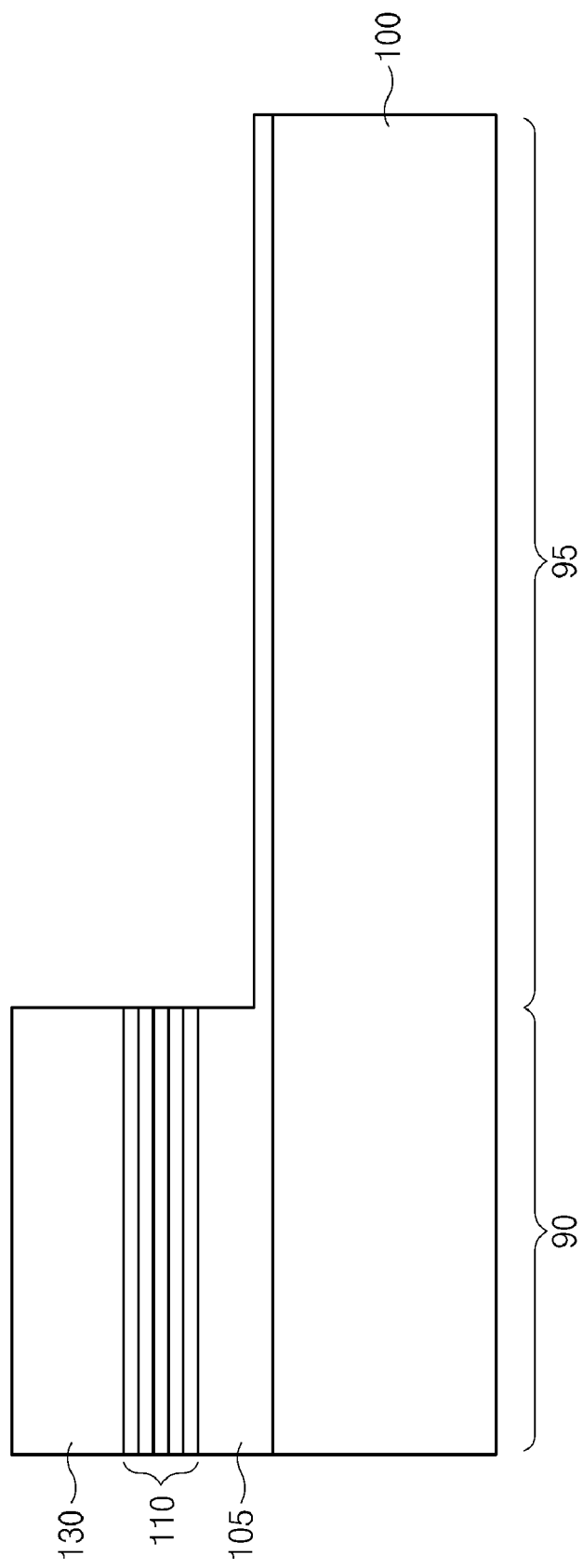

LASER DEVICE

CROSS-REFERENCE TO RELATED APPLICATIONS

This U.S. non-provisional patent application claims priority under 35 U.S.C. §119 of Korean Patent Application No. 10-2009-0126310, filed on Dec. 17, 2009, the entire contents of which are hereby incorporated by reference.

BACKGROUND OF THE INVENTION

The present invention disclosed herein relates to a laser device, and more particularly, to a multiple distributed Bragg reflector type laser device.

Semiconductor-based optical devices may be manufactured through a variety of semiconductor processes such as a growth process, a photolithography process, an etching process, a deposition process, and/or the like. By using the semiconductor processes, the semiconductor-based optical devices can be reduced in their sizes, costs and/or mass-produced. Accordingly, many researches on the semiconductor-based optical devices have been progressed.

Among the semiconductor-based optical devices, functional laser devices for selecting specific wavelengths, such as a distributed feedback laser diodes and/or distributed Bragg reflector type laser diodes, have been developed. The functional laser devices can perform wavelength filtering using diffraction gratings. For example, a light wave having a specific wavelength corresponding to a Bragg wavelength can be reflected. That is, the wavelength filtering is realized. The reflected light wave having the specific wavelength is oscillated by feedback to a gain region. The functional laser devices may be used as not only light sources for communication but also light sources for generating terahertz (Thz) waves by for example photo-mixing.

A frequency doubling method, a backward wave oscillator, a photo-mixing method, a carbon dioxide pumping gas laser, a quantum cascade laser, a free electron laser, and the like are used for generating the terahertz waves. In the photo-mixing method, beating signals of two different laser beams are incident on the photo-mixer to attain a terahertz wave corresponding to a beating cycle. For the photo-mixing method, a frequency of at least one of the two different laser beams should be stably continuously tuned. In addition, properties of the two different laser beams should be harmonized with each other. In order to meet these requirements, additional devices are further required and thus an apparatus for performing the photo-mixing method for generating the terahertz waves is large-sized and complicated. In addition, the cost for the apparatus increases.

SUMMARY OF THE INVENTION

The present invention provides a laser device having excellent reliability.

The present invention also provides a laser device that is optimized in high integration.

The present invention also provides a laser device that can continuously tune a wavelength.

The present invention also provides a laser device that can generate a variable, stable terahertz wave.

Embodiments of the present invention provide laser devices including; a 1×2 splitter disposed on a substrate and having a stem core, a first twig core, and a second twig core; an active layer connected to the stem core, generating lights of a plurality of wavelengths and providing a gain for the lights; a first diffraction grating coupled to the first twig core; a second diffraction grating coupled to the second twig core; an active layer-micro heater supplying heat to the active layer; and a first micro heater and a second micro heater supplying heats to the first and second diffraction gratings, respectively.

In some embodiments, the active region may provide a spectral gain and the spectral gain may vary by the heat from the active layer-micro heater.

In other embodiments, a refractive index of the first diffraction grating may vary and a refractive index of the second diffraction grating may vary by the heat from the second micro heater.

In still other embodiments, the active layer-micro heater may operate to supply the heat to the active layer while at least one of the first and second micro heaters operates to supply the heat.

In even other embodiments, the laser device may further include; a first lower cladding layer between the active layer and the substrate; a first upper cladding layer on the active layer; a gain electrode electrically coupled to the first upper cladding layer; a second lower cladding layer between the 1×2 splitter and the substrate; and a second upper cladding layer on the 1×2 splitter.

In yet other embodiments, the 1×2 splitter may be formed of a semiconductor material. In this case, the first and second lower cladding layers may be formed of the same material as each other. And the first and second upper cladding layers may be formed of the same material as each other.

In further embodiments, the 1×2 splitter may be formed of polymer having a greater thermooptic coefficient than a semiconductor material. In this case, the second lower and upper cladding layers may be formed of polymer having a less refractive index than the 1×2 splitter. In addition, the first and second diffraction gratings may be formed of polymer.

In still further embodiments, the active layer-micro heater may be disposed above the gain electrode, the first micro heater may be disposed on the second upper cladding layer on the first twig core, and the second micro heater may be disposed on the second upper cladding layer on the second twig core.

In even further embodiments, the laser device may further include an insulation layer disposed between the active layer-micro heater and the gain electrode, between the first micro heater and the second upper cladding layer, and between the second micro heater and the second upper cladding layer.

In even yet embodiments, the laser device may further include a first thermal insulator, a second thermal insulator, and a third thermal insulator disposed on the substrate and spaced apart from each other in a lateral direction. At this point, the first twig core may be disposed between the first and second thermal insulators and the second twig core may be disposed between the second and third thermal insulators.

In even yet other embodiments, the first, second, and third insulators may include at lease one of nitride and air.

In even further yet embodiments, the first diffraction grating may have a same grating period as a grating period of the second diffraction grating.

In even yet further other embodiments, the first diffraction grating may have a different grating period from a grating period of the second diffraction grating.

In even yet other embodiments, the active layer may be formed in a multiple quantum well structure.

In even yet other embodiments, the 1×2 splitter may further include a taper core adjacent to the active layer, wherein the taper core has a first end contacting a first end of the active layer and a second end contacting the stem core, and a width of the taper core is gradually reduced from the stem core to the active layer.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings:

FIG. 1 is a plan view of a laser device according to an embodiment,

FIG. 3 illustrates graphs illustrating characteristics of a laser device according to an embodiment, FIGS. 7A, 8A, 9A, and 10A are cross-sectional views taken along line I-I' of FIG. 1, illustrating a method for manufacturing a laser device according to an embodiment, FIGS. 11A to 11C are cross-sectional views illustrating a method for manufacturing the laser device of FIG. 4, and FIGS. 12A and 12B are cross-sectional views illustrating a method for forming the laser device of FIG. 5.

DETAILED DESCRIPTION OF PREFERRED EMBODIMENTS

Figure 2A:
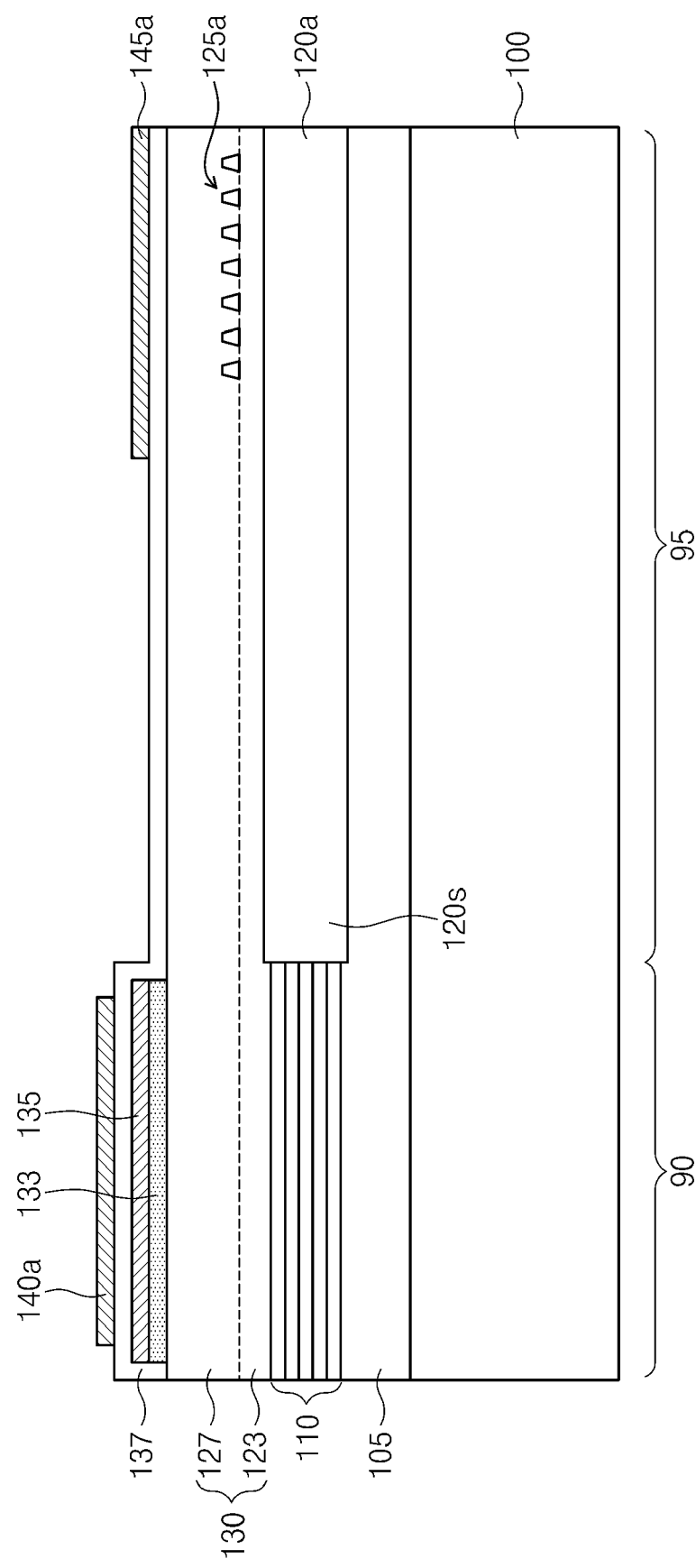
FIG. 2A is a cross-sectional view taken along line I-I' of FIG. 1.

Preferred embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

In the drawings, the dimensions of layers and regions are exaggerated for clarity of illustration. It will also be understood that when a layer (or film) is referred to as being 'on' another layer or substrate, it can be directly on the other layer or substrate, or intervening layers may also be present. Further, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present. Like reference numerals refer to like elements throughout.

Figure 2B:
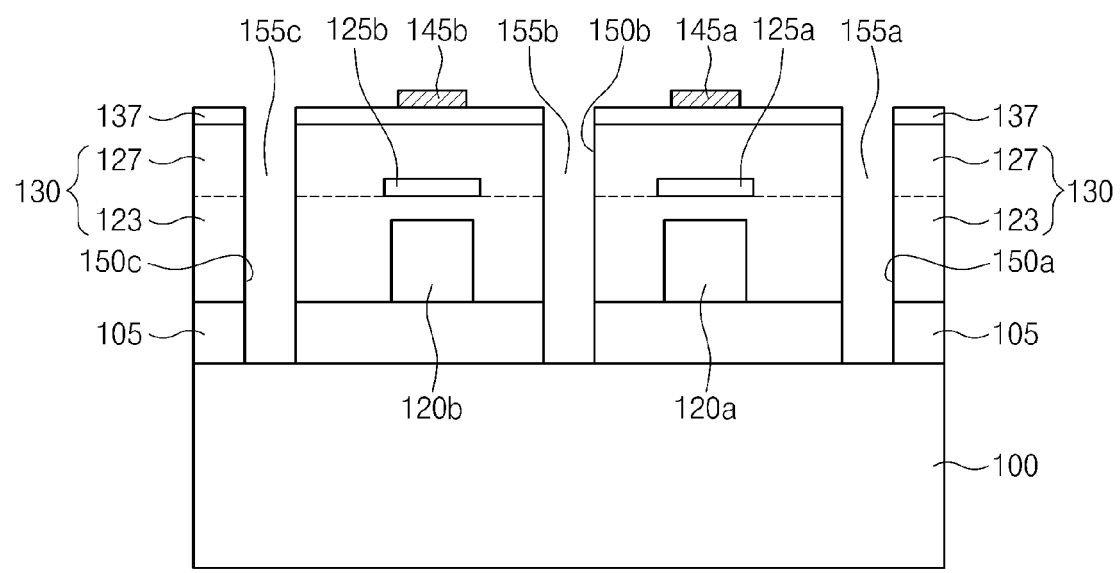
FIG. 2B is a cross-sectional view taken along line II-II' of FIG. 1.

FIG. 1 is a plan view of a laser device according to an embodiment, FIG. 2a is a cross-sectional view taken along line I-I' of FIG. 1, and FIG. 2b is a cross-sectional view taken along line II-II' of FIG. 1.

Referring to FIGS. 1, 2A, and 2B, a substrate 100 includes a gain region 90 and a Bragg reflection region 95. The substrate 100 may be a semiconductor substrate. For example, the substrate 100 may be formed of a compound semiconductor. For example, the substrate 100 may be an indiumphosphide (InP) substrate. However, the present invention is not limited to this. The substrate 100 may be formed of other semiconductor materials.

An active layer 110 is formed on the substrate 100 of the gain region 90. A 1×2 splitter is disposed on the substrate 100 of the Bragg reflection region 95. The active layer 110 may generate lights of a plurality of wavelengths by an operational current. In addition, the active layer 110 may provide a gain for the lights. The 1×2 splitter may perform 1×2 light distribution. The 1×2 splitter may include a stem core 120s, a first twig core 120a, and a second twig core 120b. The stem core 120s, first twig core 120a, and second twig core 120b may be interconnected at a junction of the 1×2 splitter. The stem core 120s, first twig core 120a, and second twig core 120b may be formed of the same material as each other. As shown in the drawings, the 1×2 splitter may be provided in the form of a y-branch. Alternatively, the 1×2 splitter may be provided in the form of a multi-mode interference (MMI) device.

A first end of the active layer 110 is connected to one end of the stem core 120s. According to one embodiment, the active layer 110 and the stem core 120s may be directly interconnected by a butt coupling method. Alternatively, the active layer 110 and the stem core 120s may be interconnected by other methods that will be described later.

The active layer 110 may be formed of a compound semiconductor. The active layer 110 may be formed in a multiple quantum well structure. For example, the actively layer 110 may be formed by alternately stacking a first InGaAsP layer (well) and a second InGaAsP layer (barrier) having band gaps different from each other. Alternatively, according to one embodiment, the active layer 110 may be formed in a bulk state formed of InGaAsP having a band gap wavelength of about 1.55-about 1.2 μl. The active layer 110 may be an intrinsic state. According to one embodiment, the 1×2 splitter may be a core of a passive waveguide formed of a semiconductor material.

As shown in FIG. 2A, a lower cladding layer 105 is disposed between the active layer 110 and the substrate 100. The lower cladding 105 may extend laterally to be disposed between the 1×2 splitter and the substrate 100. That is, the lower cladding 105 may extend into the Bragg reflection region 95 to be disposed between the stem core 120s and the substrate 100, between the first twig core and the substrate 100, and between the second twig core 120b and the substrate 100. A portion of the lower cladding 105 between the active layer 110 and the substrate 100 corresponds to a first lower cladding layer and a portion of the lower cladding 105 between the 1×2 splitter and the substrate 100 corresponds to a second lower cladding layer. As shown in FIG. 2A, according to one embodiment, the first and second lower cladding layers may be defined by the portions of the lower cladding layer 105 and thus formed of the same material as each other.

An upper cladding layer 130 may be disposed on the active layer 110. The upper cladding layer 130 may cover a top surface and both sidewalls of the active layer 110. The upper cladding layer 130 may extend into the Bragg reflection region 95 to be disposed on the 1×2 splitter. For example, the upper cladding layer 130 may extend to cover a top surface and both sidewalls of the 1×2 splitter. The upper cladding layer 130 includes a first layer 123 and a second layer 127 on the first layer 123. A portion of the upper cladding layer 130 on the active layer 110 in the gain region 90 corresponds to a first upper cladding layer and a portion of the upper cladding layer 130 on the 1×2 splitter in the Bragg reflection region 95 corresponds to a second upper cladding layer. As described above, according to one embodiment, the first and second upper cladding layers may be portions of the upper cladding layer 130 and thus they are formed of the same material as each other.

The lower cladding layer 105 may be formed of a compound semiconductor doped with first dopants. The upper cladding layer 105 may be formed of a compound semiconductor doped with second dopants. One of the first and second dopants is an n-type dopant and the other is a p-type dopant. For example, the lower cladding layer may be formed of n-type InP, and at least an upper portion (the second layer 127) of the upper cladding layer 130 may be formed of a p-type InP. Alternatively, the lower cladding layer may be formed of the p-type InP, and at least the upper portion (the second layer 127) of the upper cladding layer 130 may be formed of the n-type InP.

Although not shown in the drawings, a first separate hetero layer may be disposed between the active layer 110 and the lower cladding layer 105. In addition, a second separate hetero layer may be disposed between the active layer 110 and the upper cladding layer 130. The first and second separate hetero layers may be formed of a compound semiconductors having the less band gap wavelength than the active layer 110. For example, the first and second separate hetero layers may be formed of InGaAsP having a band gap wavelength of about 1.3 μm.

As shown in FIGS. 1, 2A, and 2B, first and second diffraction gratings 125a and 125b are disposed above the substrate 100 in the Bragg reflection region 95. The first diffraction grating 125a is coupled to the first twig core 120a and the second diffraction grating 125b is coupled to the second twig core 120b. According to one embodiment, as shown in FIGS. 2A and 2B, the first diffraction grating 125a may be disposed above the first twig core 120a and the second diffraction grating 125b may be disposed above the second twig core 120b. In this case, the first and second diffraction gratings 125a and 125b may be disposed in the upper cladding layer 130 in the Bragg reflection region 95. In more detail, the first and second diffraction gratings 125a and 125b may be disposed between the first and second layers 123 and 127 of the upper cladding layer 130. However, the present invention is not limited to this. According to other embodiment, the first diffraction grating 125a may be disposed under the first twig core 120a and the second diffraction grating 125b may be disposed under the second twig cores 120b. According to one embodiment, the first and second diffraction gratings 125a and 125b may be formed of a semiconductor material.

According to one embodiment, the first diffraction grating 125a may have a same grating period as a grating period of the second diffraction grating 125a. Alternatively, the first diffraction grating 125a may have a different grating period from a grating period of the first diffraction grating 125b.

A gain electrode 135 is disposed on the upper cladding layer 130 on the active layer 110 in the gain region 90. The gain electrode 135 is electrically connected to the upper cladding layer (i.e., the first upper cladding layer) 130 under the gain electrode 135. An ohmic layer 133 may be disposed between the gain electrode 135 and the upper cladding layer 130.

An active layer-micro heater 140a is disposed above the active layer 110. A first micro heater 145ta is disposed above the first diffraction grating 125a and a second micro heater 145b is disposed above the second diffraction grating 125b. The active layer-micro heater 140a can supply heat to the active layer 110. And the first and second micro heaters 145a and 145b can supply heat to the first and second diffraction gratins 125a and 125b, respectively. The active layer-micro heater 140a may be disposed above the gain electrode 135 and the first and second micro heaters 145a and 145b may be disposed on the upper cladding layer 130 on the first and second diffraction grating 125a and 125b, respectively. The active layer-micro heater 140a and the gain electrode 135 may be electrically insulated from each other. An insulation layer 137 may be disposed between the active layer-micro heater 140a and the gain electrode 125, between the first micro heater 145a and the upper cladding layer 130, and between the second micro heater 145a and the upper cladding layer 130. The insulation layer 137 may be formed of nitride.

The micro heaters 140a, 145a, and 145b supply the heat using joule's heat. The micro heaters 140a, 145a, and 145b may be formed of a material having electrical resistance. For example, the micro heaters 140a, 145a, 145b may be formed of metal such as chrome (Cr), gold (Au), and the like. According to one embodiment, the chrome contained in the micro heaters 140a, 145a, and 145b may be used as a resistor. According to one embodiment, the gold contained in the micro heaters 140a, 145a, and 145b may be used for the bonding with a connection ball or for the resistor. However, the present invention is not limited to this. The micro heaters 140a, 145a, and 145b may be formed with other materials having electrical resistance.

A first thermal insulator 155a, a second thermal insulator 155b, and a third thermal insulator 155c may be disposed on the substrate 100 in the Bragg reflection region 95. The first, second and third thermal insulators 155a, 155b and 155c are spaced apart from each other. The first, second, and third thermal insulators 155a, 155b, and 155c may extend in parallel with the first and second twig cores 120a and 120b. The first twig core 120a may be disposed between the first and second thermal insulators 155a and 155b and the second twig core 120b may be disposed between the second and third thermal insulators 155b and 155c. The first micro heater 145a may be disposed between the first and second thermal insulators 155a and 155b and the second micro heater 145b may be disposed between the second and third thermal insulators 155b and 155c. The heat generated by the first and second micro heaters 145a and 145b can be locally supplied by the thermal insulators 155a, 155b, and 155c. For example, due to the thermal insulators 155a, 155b, and 155c, it can be minimized that the heat generated by the first micro heater 145a affects the second diffraction grating 125b and/or the second twig core 120b. Likewise, due to the thermal insulators 155a, 155b and 155c, it can be minimized that the heat generated by the second micro heater 145b affect the first diffraction grating 125a and/or the first twig core 120a.

The first, second and third thermal insulators 155a, 155b, and 155c may fill a first trench 150a, a second trench 150b, and a third trench 150c, respectively. The first, second and third trenches 150a, 150b and 150b may be formed through the upper and lower cladding layers 130 and 105. The trenches 150a, 150b, and 150c may fully pass through the lower cladding layer 105 to expose the substrate 100. The thermal insulators 155a, 155b, and 155c may include air that fill the first, second, and third trenches 150a, 150b, and 150c, respectively. The trenches 150a, 150b, and 150c may extend upward to pass through the insulation layer 137.

The current is supplied to the lower cladding layer (i.e., the first lower cladding layer) 105, active layer 110, and upper cladding layer (i.e., the first upper cladding layer) 130, which are stacked in the gain region 90, through the gain electrode 135. Accordingly, lights of a plurality of wavelengths may be generated in the active layer 110. The generated lights may be distributed by the 1×2 splitter and transferred to the first and second twig cores 120a and 120b. A first distributed light transferred to the first twig core 120a may be Bragg-reflected by the first diffraction grating 125a to oscillate a first laser light having a first wavelength that is a central wavelength. Likewise, a second distributed light transferred to the second twig core 120b may be Bragg-reflected by the second diffraction grating 125b to oscillate a second laser light source having a second wavelength that is a central wavelength. The first and second laser lights may be output through a second end of the active layer 110 via the stem core 120s and the active layer 110. The second end of the active layer 110 may be opposite to the first end of the active layer 110 that is connected to the stem core 120s. The active layer 110 may provide gain for the first and second laser lights.

According to one embodiment, a dielectric layer for controlling the reflectance may be coated on the second end of the active layer 110. In more detail, by the dielectric layer, the reflectance of the second end of the active layer 110 can be less than the reflectance of the first and second diffraction gratings. Therefore, the oscillation of the first and second laser lights through the second end of the active layer 110 can be enhanced.

The first wavelength of the first laser light may be affected by the grating period of the first diffraction grating 125a. For example, in a state where the first micro heater 145a is not operating, the first wavelength of the first laser light may be determined by the grating period of the first diffraction grating 125a. The refractive index of the first diffraction grating 125a varies by the heat supplied from the first micro heater 145a. As the temperature of the heat of the first micro heater 145a continuously varies, the refractive index of the first diffraction grating 125a can continuously vary. The first wavelength of the first laser light can vary by the refractive index variation of the first diffraction grating 125a. In more detail, by continuously varying the temperature of the heat supplied by the first micro heater 145a, the first wavelength of the first laser light can continuously vary.

Likewise, the second wavelength of the second laser light may be affected by the grating period of the second diffraction grating 125b. For example, in a state where the second micro heater 145b is not operating, the second wavelength of the second laser light may be determined by the grating period of the second diffraction grating 125b. The refractive index of the second diffraction grating 125b varies by the heat supplied from the second micro heater 145b. As the temperature of the heat of the second micro heater 145b continuously varies, the refractive index of the second diffraction grating 125b can continuously vary. The second wavelength of the second laser light can vary by the refractive index variation of the second diffraction grating 125b. In more detail, by continuously varying the temperature of the heat supplied by the second micro heater 145b, the second wavelength of the second laser light can continuously vary.

As described above, the active layer 110 in the gain region 90 may provide the gain for the first and second laser lights. The active layer 110 may provide a spectral gain for wavelengths. For example, the active layer 110 may provide different gains to lights having wavelengths different from each other. The spectral gain of the active layer 110 varies by the heat supplied by the active layer-micro heater 140a. Therefore, after the first and/or second micro heaters 145a and/or 145b are operated, different between the gains for the first and second wavelengths can be minimized. Hereinafter, this will be described with reference to FIG. 3.

FIG. 3 illustrates graphs illustrating characteristics of the laser device according to the embodiment.

Referring FIGS. 1, 2A, 2B and 3, a graph (a) in FIG. 3 shows a gain curve in a state where the micro heaters 140a, 145a, and 145c are not operating. As illustrated in the graph (a), in a state where the active layer-micro heater 140a is not operating, the gain curve 200 of the active layer 110 may include a central wavelength $\lambda$ m providing a maximum gain Gm. According to the gain curve 200, the active layer 110 may provide a gain less than the maximum gain Gm for the light having a wavelength shorter than the central wavelength $\lambda$ m. In addition, the active layer 110 may provide a gain less than the maximum gain Gm for the light having a wavelength longer than the central wavelength $\lambda$ m. In the graph (a), the reference numeral 210 indicates the first wavelength 210 of the first laser light and the reference numeral 220 denotes the second wavelength 220 of the second laser light. In a state where the first and second micro heaters 145a and 145b are not operating, the grating periods of the first and second diffraction gratings 125a and 125b may be different from each other Therefore, as illustrated in the graph (a) the first and second wavelength 210 and 220 may be different from each other. On the other hand, as described previously, as the first and second diffraction gratings 125a and 125b may have the same period as each other, the first and second wavelengths 210 and 220 may have the same period. In this case, the first and second wavelengths 210 and 220 may overlap each other.

A graph (b) of FIG. 3 illustrates a gain curve in a state where the active layer-micro heater 140a and second micro heater 145b operate and the first micro heater 145a is not operating. Because of the variation of the refractive index of the second diffraction grating 125b by the second reflective micro heater 145b, the second wavelength 220 varies. In the graph (b), the reference numeral 220a indicates a varied second wavelength. By supplying the heat to the active layer 110 by the active layer-micro heater 140a, the gain curve 200 varies. In the graph (b), the reference numeral 200a indicates a varied gain curve. By the supply of the heat of the active layer-micro heater 140a, the varied gain curve 200a is shifted from the gain curve 200. Accordingly, a difference between the gain provided for the varied second wavelength 220a and the gain provided for the first wavelength 210 can be minimized If the active layer-micro heater 140a is omitted, the gain curve 200 is not varied and thus the gain provided for the varied second wavelength 220a may be greatly less than the gain provided for the first wavelength 210. Accordingly, a difference between the intensity of the first laser light output through the active layer 110 and the intensity of the second laser light output through the active layer 110 may be greatly increased. In this case, the characteristics of the laser device using the first and second laser lights can be greatly deteriorated.

However, as described above, according to one embodiment, the gain curve 200 of the active layer 110 varies by the active layer-micro heater 140a and a sufficient gain can be provided for the varied second wavelength 220a by the varied gain curve 200a. As a result, different between intensities of the first and second laser lights can be minimized According to one embodiment, a central wavelength $\lambda$ mc providing the maximum gain Gm of the varied gain curve 200a may be longer than the central wavelength $\lambda$ m of the gain curve 200 before the variation. That is, a gain center (e.g., a central wavelength providing the maximum gain) of the active layer 110 may be shifted to the long wavelength by the active layer-micro heater 140a. The central wavelength $\lambda$ mc of the varied gain curve 200a may be a wavelength between the first wavelength 210 and the varied second wavelength 220a. According to one embodiment, the central wavelength λ mc of the varied gain curve 200a may be located at a center between the first wavelength 210 and the varied second wavelength 220a. Therefore, a gain provided for the first wavelength 210 may be substantially the same as a gain provided the varied second wavelength 220a.

The operational states of the micro heaters 140a, 145a, and 145b described in FIG. 3 may be one embodiment for describing the concept of the present invention. Accordingly, the present invention is not limited to the operational states. According to some embodiment, when at least one of the first and second micro heaters 145a and 145b operate, the gain curve of the active layer 110 may vary by the operation of the active layer-micro heater 140a.

According to the laser device having the above-described structure, the first and second micro heaters 145a and 145b are respectively coupled to the first and second diffraction gratings 125a and 125b. Accordingly, the first wavelength of the first laser light and/or the second wavelength of the second laser light oscillated by the Bragg reflection can be continuously varied. In addition, the gain curve of the active layer 110 can be varied by supplying the heat from the active layer-micro heater 140a to the active layer 110. Therefore, the difference between the intensities of the first and second laser lights can be minimized. In the result, the laser device having excellent reliability can be realized. Further, the first and second laser lights are provided to a photo-mixer via an oscillator and the like, such that the changeable and stable terahertz wave can be generated.

Meanwhile, the 1×2 splitter may be formed of a semiconductor material. Alternatively, the 1×2 splitter may be formed of other materials. This will be described with reference to FIG. 4. In the modified example of FIG. 4 and the previously described embodiment, the same reference numbers will be used to refer to the same elements.

Figure 4:
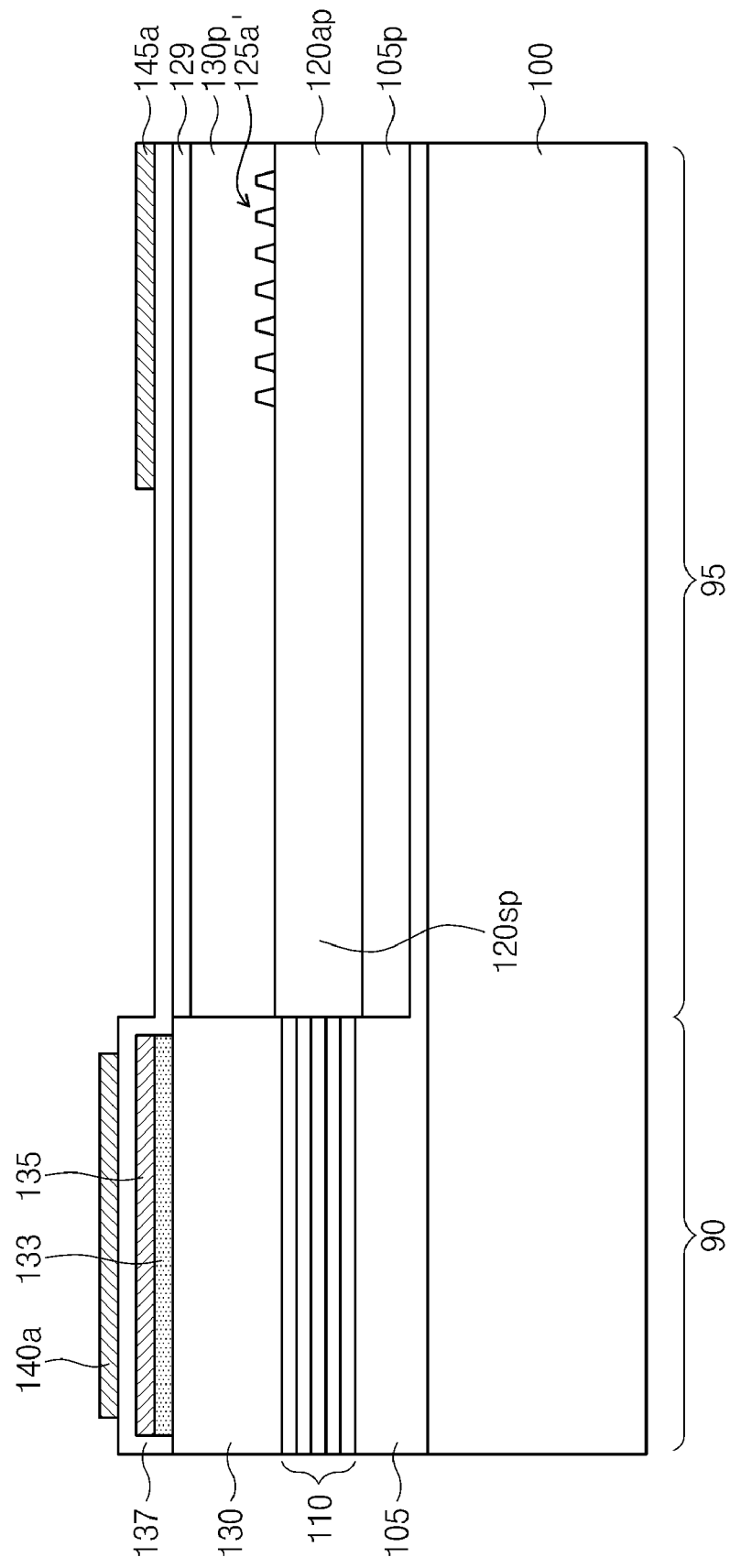
FIG. 4 is a cross-sectional view taken along line I-I' of FIG. 1, illustrating a modified example of a laser device according to an embodiment.

FIG. 4 is a cross-sectional view taken along line I-I' of FIG. 1, illustrating a modified example of the laser device.

Referring to FIG. 4, a 1×2 splitter is disposed on a substrate 100 of a Bragg reflection region 95. The 1×2 splitter may include a stem core 120 sp, a first twig core 120ap, and a second twig core. One end of the stem core 120 sp is connected to a first end of the active layer 110 in a gain region 90.

The 1×2 splitter may be formed of polymer having a greater thermooptic coefficient than the semiconductor material. A second lower cladding layer 105p may be disposed between the 1×2 splitter and the substrate 100 of the Bragg reflection region 95 and a second upper cladding layer 130p may be disposed on the 1×2 splitter. At this point, the second lower and upper cladding layers 105p and 130p have a less refractive index than the 1×2 splitter. A lower cladding layer 130 in the gain region 90 may extend to be disposed between the second lower cladding layer 105p and the substrate 100 in the Bragg reflection region 95. The extending portion of the lower cladding layer 130 in the Bragg reflection region 95 may be thinner than the lower cladding layer 130 in the gain region 90.

A first diffraction grating 125a' is coupled to the first twig core 125ap. The first diffraction grating 125a' may be disposed between the second upper cladding layer 130p and the first twig core 125ap. However, the present invention is not limited to this. The first diffraction grating 125a' may be disposed under the first twig core 125ap. The first diffraction grating 125a' may be also formed of polymer. A second diffraction grating is coupled to the second twig core. The second diffraction grating may be disposed between the second upper cladding layer 130p and the second twig core. Alternatively, the second diffraction grating may be disposed under the second twig core. The second diffraction grating may be also formed of polymer.

A capping layer 129 may be disposed on the second upper cladding layer 130p. The capping layer 129 may be disposed only in the Bragg reflection region 95. The capping layer 129 may have a top surface coplanar with a top surface of the cladding layer 130 in the gain region 90. The capping layer 129 may include a dielectric material such as nitride, oxide, and the like.

According to one embodiment, the thermal insulators 155a, 155b, and 155c illustrated in FIGS. 1, 2A, and 2B may include air. Alternatively, the thermal insulators may be formed of other materials. This will be described with reference to the accompanying drawing.

Figure 5:
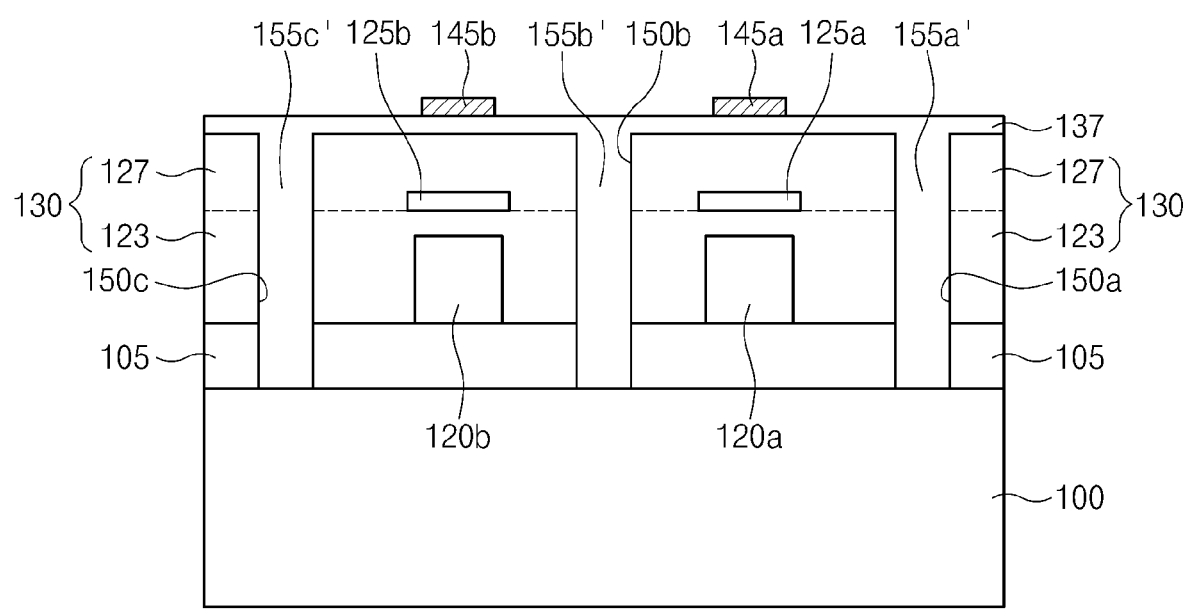
FIG. 5 is a cross-sectional view taken along line II-II' of FIG. 1, illustrating another modified example of a laser device according to an embodiment.

FIG. 5 is a cross-sectional view taken along line II-II' of FIG. 1, illustrating another modified example of the laser device.

Referring to FIG. 5, first, second, and third thermal insulators 155a', 155b' and 155c' may be formed of nitride filling first, second, and third trenches 150a, 150b, and 150c, respectively. According to one embodiment, an insulation layer 137 may extend to fill the first, second, and third trenches 150a, 150b, and 150c, such that portions of the insulation layer 137, which fill the first, second, and third trenches 150a, 150b, and 150c, correspond to the first, second, and third thermal insulators 155a', 155b', and 155c', respectively.

Figure 6:
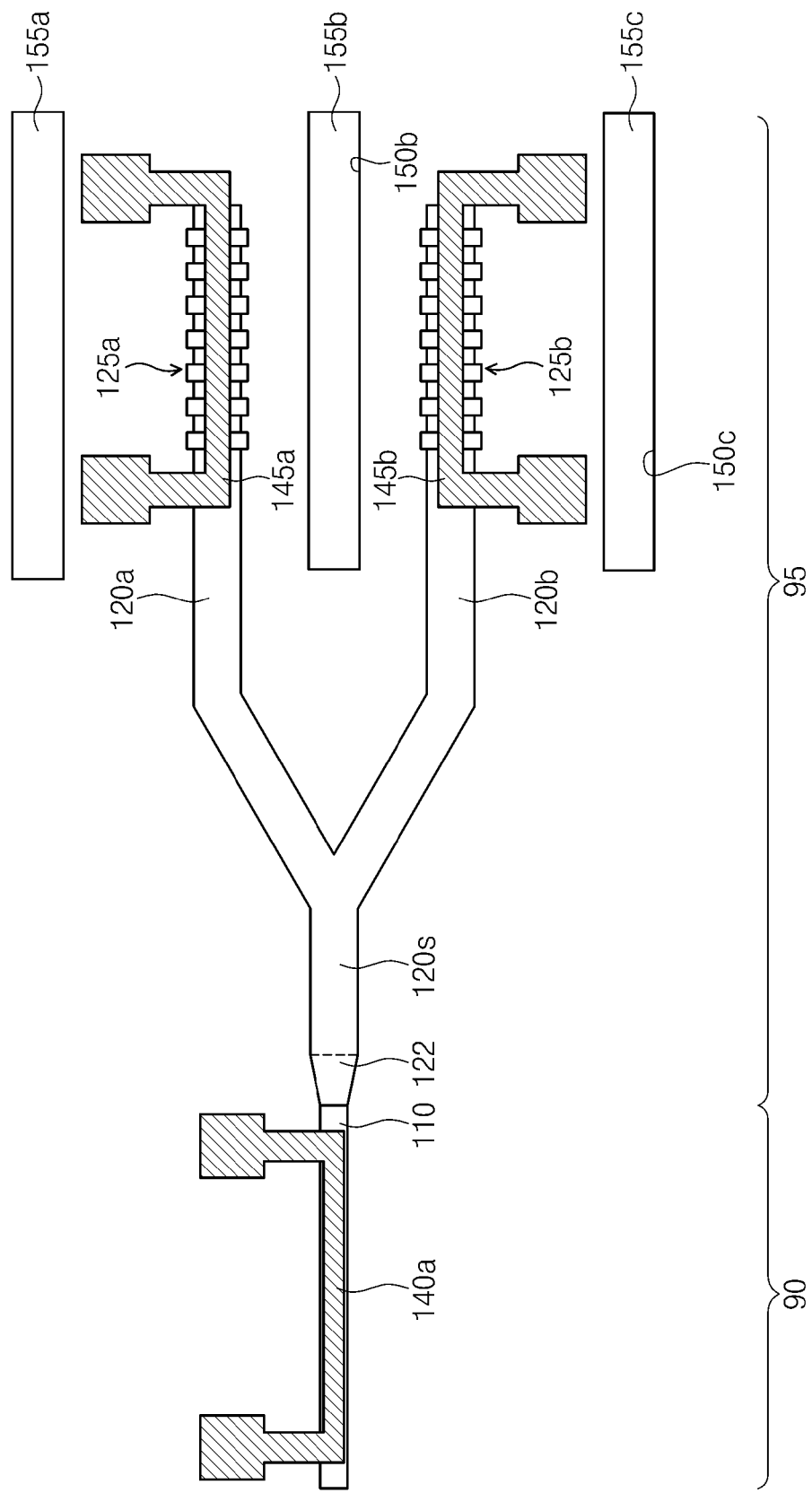
FIG. 6 is a plan view illustrating another modified example of a laser device according to an embodiment.

FIG. 6 is a plan view illustrating another modified example of the laser device.

Referring to FIG. 6, this modified example may be shown a another coupling method between the 1×2 splitter and the active layer 110. The active layer 110 and the 1×2 splitter may be coupled by an evanescent coupling method using an adiabatic variation of the refractive index. For example, the 1×2 splitter may further include a taper core 122 adjacent to the active layer 110. The taper core 122 may be disposed between the stem core 120s and the active layer 110. A first end of the taper core 122 may contact the stem core 120s and a second end of the taper core 122 may contact one end of the active layer 110. At this point, a width of the taper core 122 may be gradually reduced from the stem core 120s to the active layer 110. Therefore, the refractive index of the taper core 122 may be adiabatically changeable, such that the active layer 110 and the 1×2 splitter may be coupled to each other by the evanescent coupling method.

Next, a method for manufacturing the laser device will be described hereinafter with reference to the accompanying drawings.

FIGS. 7A, 8A, 9A and 10A are cross-sectional views taken along line I-I' of FIG. 1, illustrating a method for manufacturing the laser device according to one embodiment. FIGS. 7B, 8B, 9B, and 10B are cross-sectional views taken along line II-II' of FIG. 1, illustrating a method for manufacturing the laser device according to one embodiment.

Figure 7B:
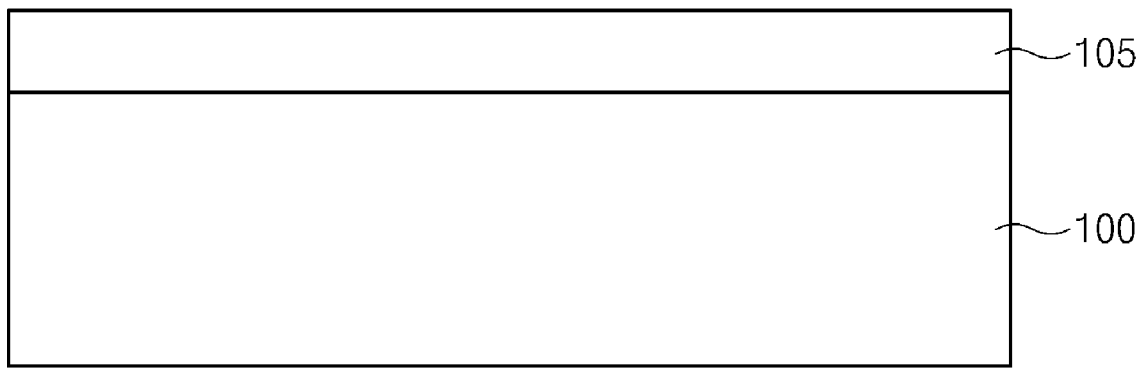
FIGS. 7B, 8B, 9B, and 10B are cross-sectional views taken along line II-II' of FIG. 1, illustrating a method for manufacturing a laser device according to an embodiment.

Referring to FIGS. 7A and 7B, a substrate 100 having a gain region 90 and a Bragg reflection region 95 is provided. A lower cladding layer 105 may be formed on the substrate 100 in the gain region 90 and the Bragg reflection region 95. A multiple semiconductor layers for a active layer may be formed on the lower cladding layer 105 and then the active layer 110 may be formed in the gain region 90 by patterning the multiple semiconductor layers. At this point, the multiple semiconductor layers in the Bragg reflection region 95 may be removed. Accordingly, the lower cladding layer 105 in the Bragg reflection region 95 may be exposed.

Figure 8B:
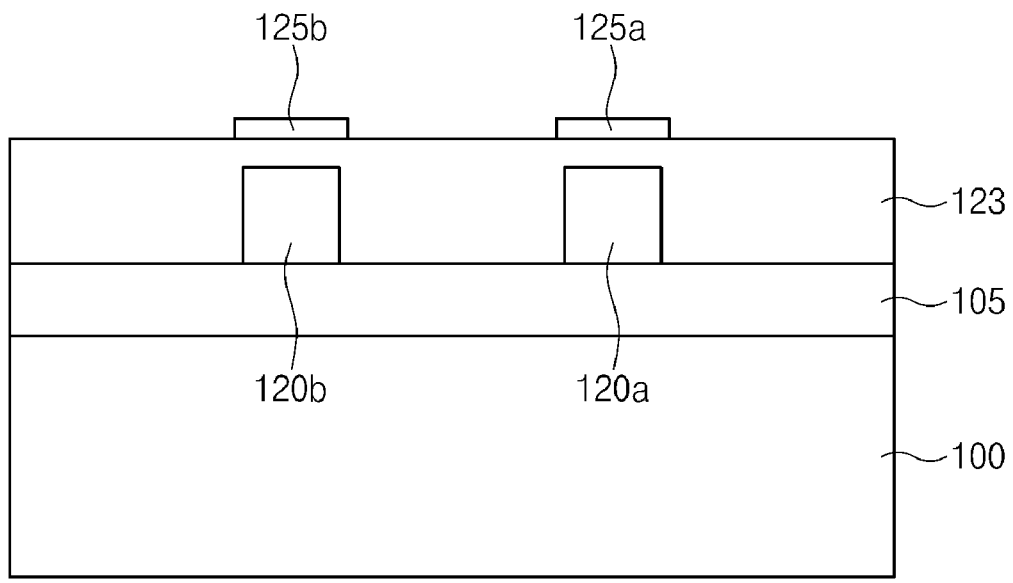

Referring to FIGS. 8A and 8B, a 1×2 splitter may be formed on the exposed lower cladding layer 105 in the Bragg reflection region 95. The 1×2 splitter includes a stem core 120s, a first twig core 120a, and a second twig core 120b (see FIG. 1). One end of the stem core 120s is connected to the active layer 110. For example, the stem core 120s may directly contact the first end of the active layer 110. Alternatively, the 1×2 splitter, as shown in FIG. 6, may further include the taper core 122, such that the 1×2 splitter may be connected to the active layer 110 by the evanescent coupling method using the adiabatic variation.

A first sub-upper cladding layer 123 covering the 1×2 splitter and the active layer 110 may be formed on the substrate 100. First and second diffraction gratings 125a and 125b may be formed on the first sub-upper cladding layer 123 in the Bragg reflection region 95. The first diffraction grating 125a may be formed above the first twig core 120a and the second diffraction grating 125a may be formed above the second twig core 120b. The first and second diffraction gratings 125a and 125b may be formed through a patterning process including a masking process using a holography system or an electron beam irradiation lithography equipment, and an etching process, and the like.

Figure 9B:
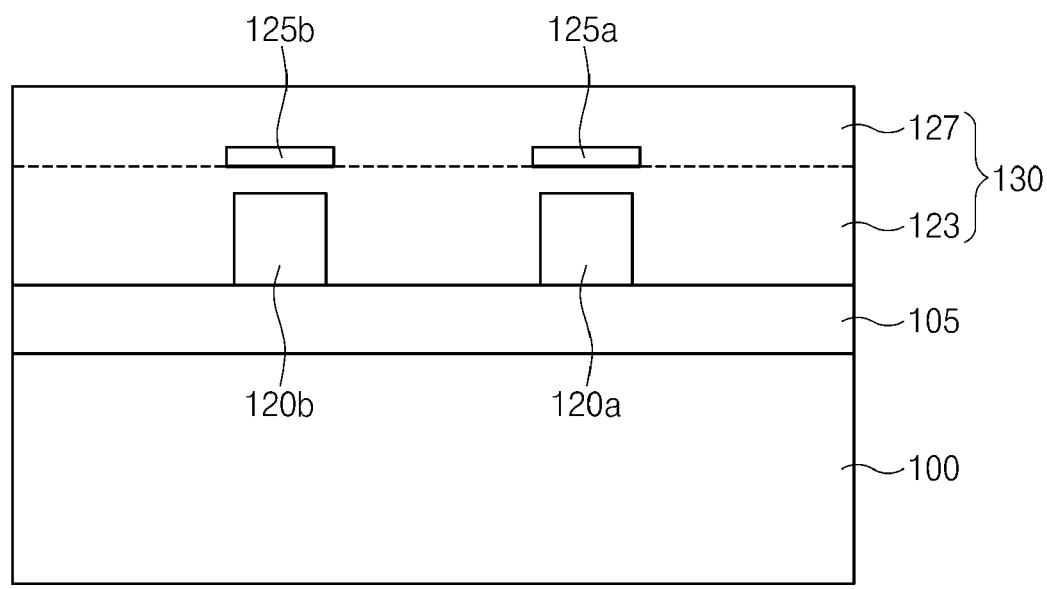

Referring to FIGS. 9A and 9B, a second sub-upper cladding layer 127 is formed on the substrate 100 having the diffraction gratings 125a and 125b. The second sub-upper cladding layer 127 may be formed on the first sub-upper cladding layer 123 and the diffraction gratings 125a and 125b in the gain region 90 and the Bragg reflection region 95. The first and second sub-upper cladding layers 123 and 127 may constitute a upper cladding layer 130.

An ohmic layer 133 and a gain electrode 135 may be sequentially stacked on the upper cladding layer 130 in the gain region 90. The ohmic layer 133 and the gain electrode 135 are electrically connected to the upper cladding layer 130 at the gain region 90.

Figure 10A:
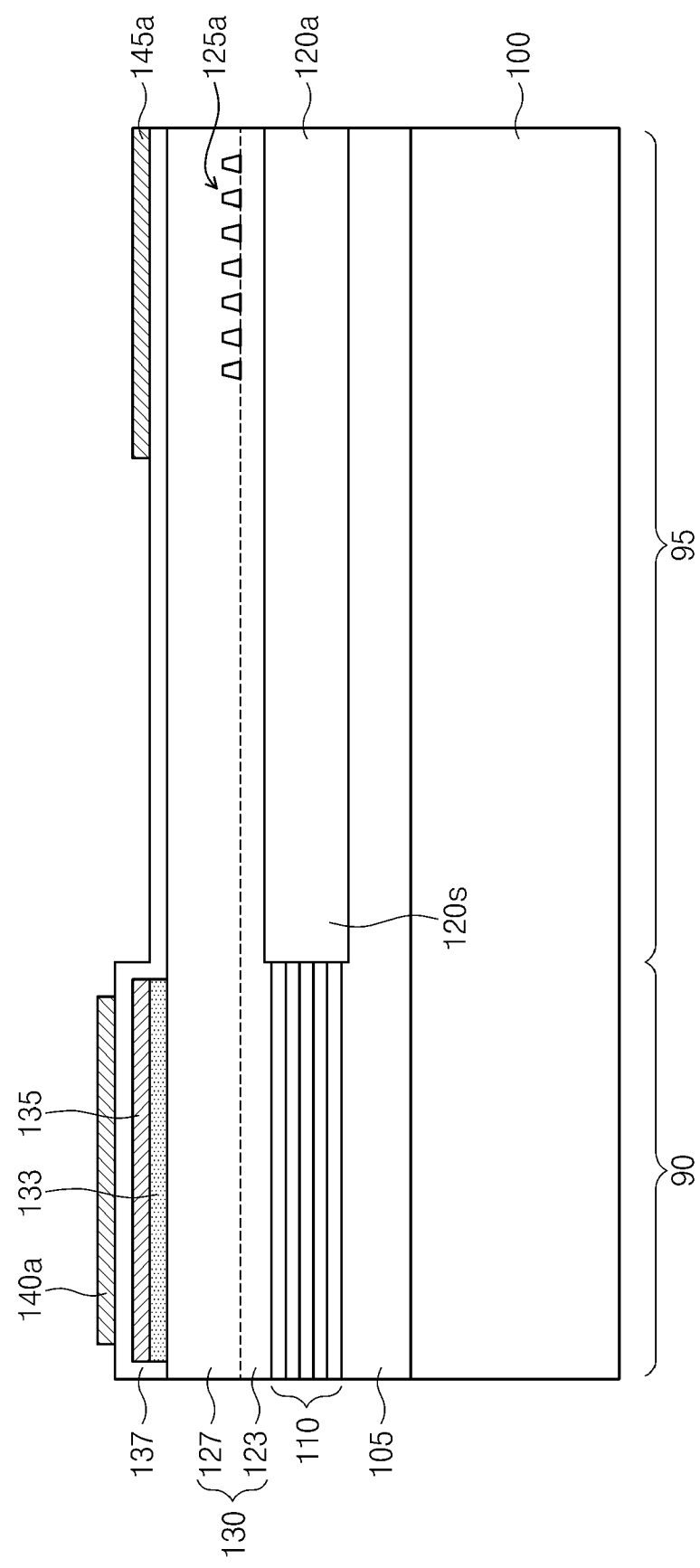
Figure 10B:
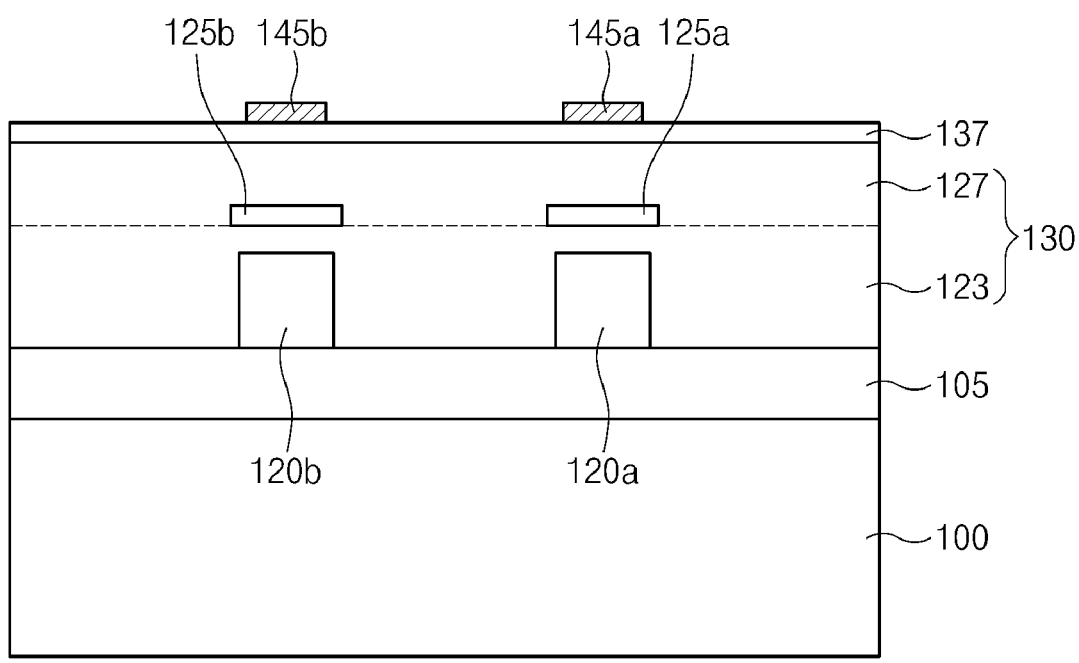

Referring to FIGS. 10A and 10B, an insulation layer 137 is formed on an entire surface of the substrate 100 having the gain electrode 135. The insulation layer 137 may be formed of nitride.

The active layer-micro heater 140a, the first micro heater 145a, and the second micro heater 145b, which are shown in FIGS. 1, 2A, and 2B, may be formed on the insulation layer 137. Next, the first, second, and third trenches 150a, 150b, and 150c of FIGS. 1 and 2B may be formed by sequentially patterning the upper and lower cladding layers 130 and 105 in the Bragg reflection region 95. The first, second, and third trenches 150a, 150b, and 150c may be filled with air to define the first, second, and third thermal insulators 150a, 150b, and 150c of FIG. 1, thereby realizing the laser device shown in FIGS. 1, 2A, and 2B.

Next, a method of manufacturing the laser device shown in FIG. 4c will be described hereinafter with reference to the accompanying drawings.

Figure 11B:
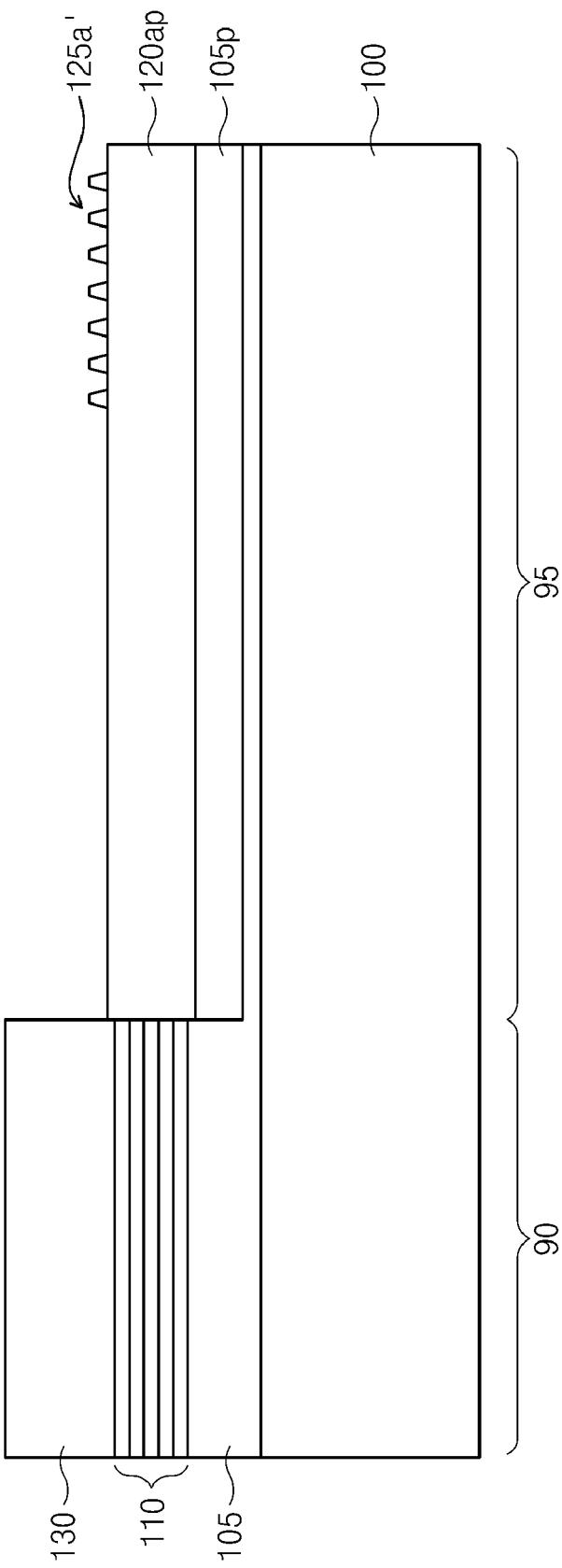
Figure 11C:
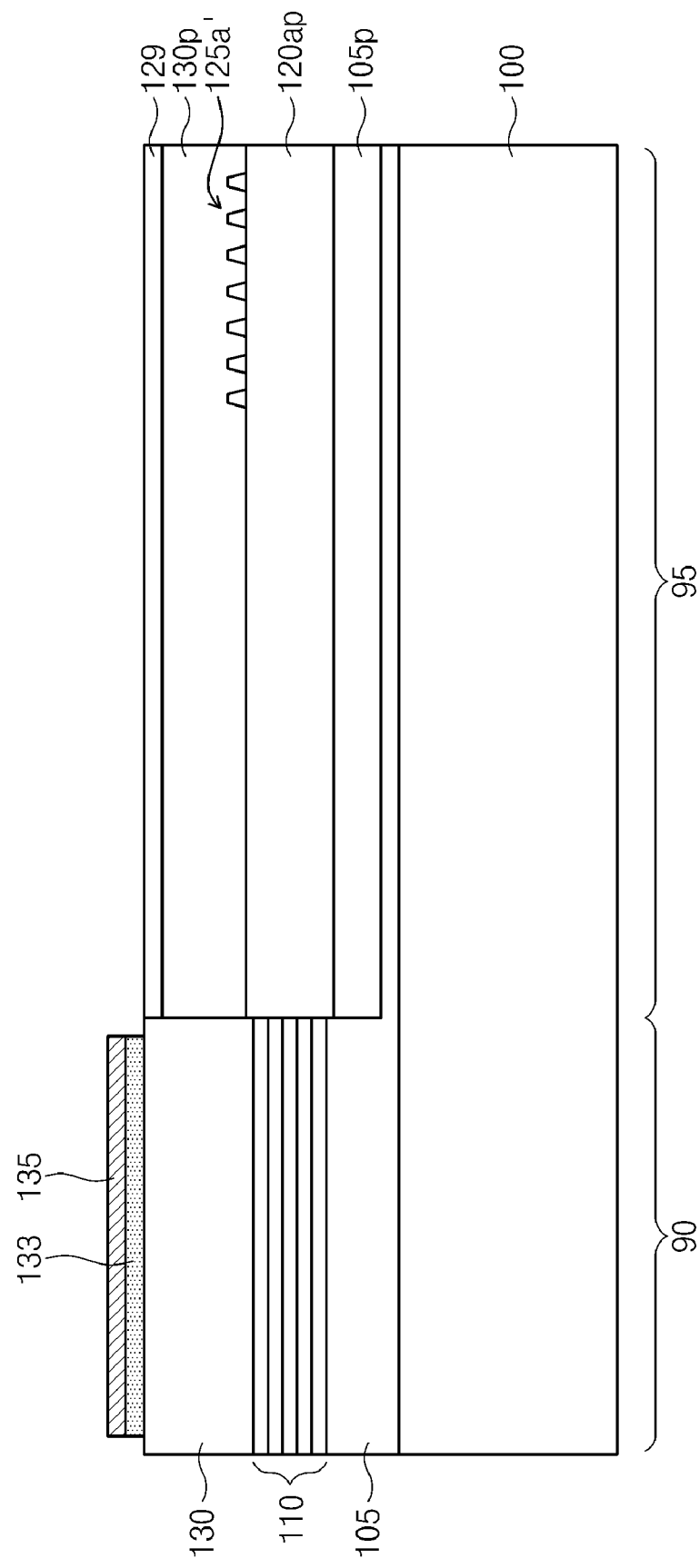

FIGS. 11A to 11C are cross-sectional views illustrating a method for manufacturing the laser device of FIG. 4.

Referring first to FIG. 11A, the lower cladding layer 105 is formed on the substrate 100 in the gain region 90 and the Bragg reflection region 95. A preliminary active layer may be formed on the lower cladding layer 105. The preliminary active layer may be provided in a line form extending from the gain region 90 into the Bragg reflection region 95. The upper cladding layer 130 may be formed on the preliminary active layer.

Next, a mask pattern (not shown) may be formed to cover the upper cladding layer 130 in the gain region 90. At this point, the upper cladding layer 130 in the Bragg reflection region 95 is exposed. The upper cladding layer 130, preliminary active layer, and lower cladding layer 105 in the Bragg reflection region 95 may be sequentially etched using the mask pattern as an etching mask. Accordingly, the upper cladding layer 130 and the preliminary active layer in the Bragg reflection region 95 are removed and thus the active layer 110 may be formed in the gain region 90. A portion of the lower cladding layer 105 in the Bragg reflection region 95 may be leaved.

Referring to FIG. 11B, a second lower cladding layer 105p may be formed on the substrate 100 in the Bragg reflection region 95. The second lower cladding layer 105p may be formed on the lower cladding layer 105 leaved in the Bragg reflection region 95. The level of the second lower cladding layer 105p may be same as or lower than the level of a bottom surface of the active layer 110 in the gain region 90.

A 1×2 splitter formed of the polymer having the greater thermooptic coefficient greater than the semiconductor material may be formed on the second lower cladding layer 105p in the Bragg reflection layer 95. The 1×2 splitter includes a stem core 120 sp, a first twig core 120ap, and a second twig core. The top surface of the 1×2 splitter may have the same level or the higher level than a top surface of the active layer 110 in the gain region 90.

a first diffraction grating 125a' on the first twig core 120ap and a second diffraction grating on the second twig core may be formed. The first and second diffraction gratings may be formed of polymer having the greater thermooptic coefficient greater than a semiconductor material. The second cladding layer 105p may be formed of polymer having the lower refractive index than the polymer of the 1×2 splitter.

Referring to FIG. 11C, a second cladding layer 130p covering the 1×2 splitter, first diffraction grating 125a', and second diffraction grating may be formed in the Bragg reflection region 95. The second upper cladding layer 130p may be formed of polymer having the lower refractive index than the polymer of the 1×2 splitter. The second lower and upper cladding layers 105p and 130p may be formed of same polymer. A top surface of the second upper cladding layer 130p may have the lower level than a top surface of the upper cladding layer 130 in the gain region 90.

Next, a capping layer 129 is formed on the second upper cladding layer 130p in the Bragg reflection region 95. The capping layer 129 may be formed of oxide, nitride, and/or the like. A top surface of the capping layer 129 may have the same level as the top surface of the upper cladding layer 130.

Next, the ohmic layer 133 and the gain electrode 135 may be sequentially stacked on the upper cladding layer 130 in the gain region 90. The following processes may be identical to the description with reference to FIGS. 10A and 10B.

Meanwhile, the trenches 150a, 150b, and 150c as described with reference to FIGS. 10A and 10B may be formed after the insulating layer 137 is formed. Alternatively, the trenches 150a, 150b, and 150c shown in FIG. 5 may be formed before the insulation layer 137 is formed. This will be described with reference to the accompanying drawings.

Figure 12A:
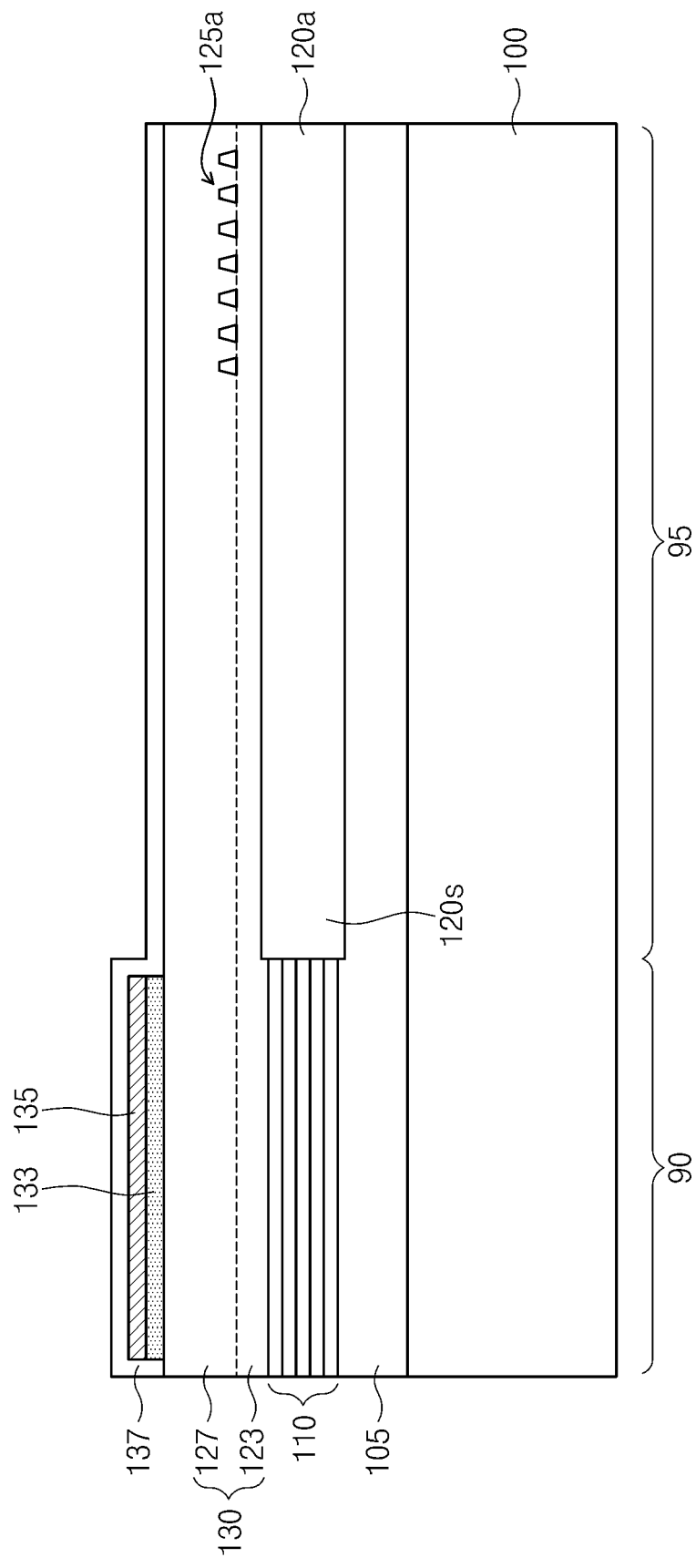
Figure 12B:
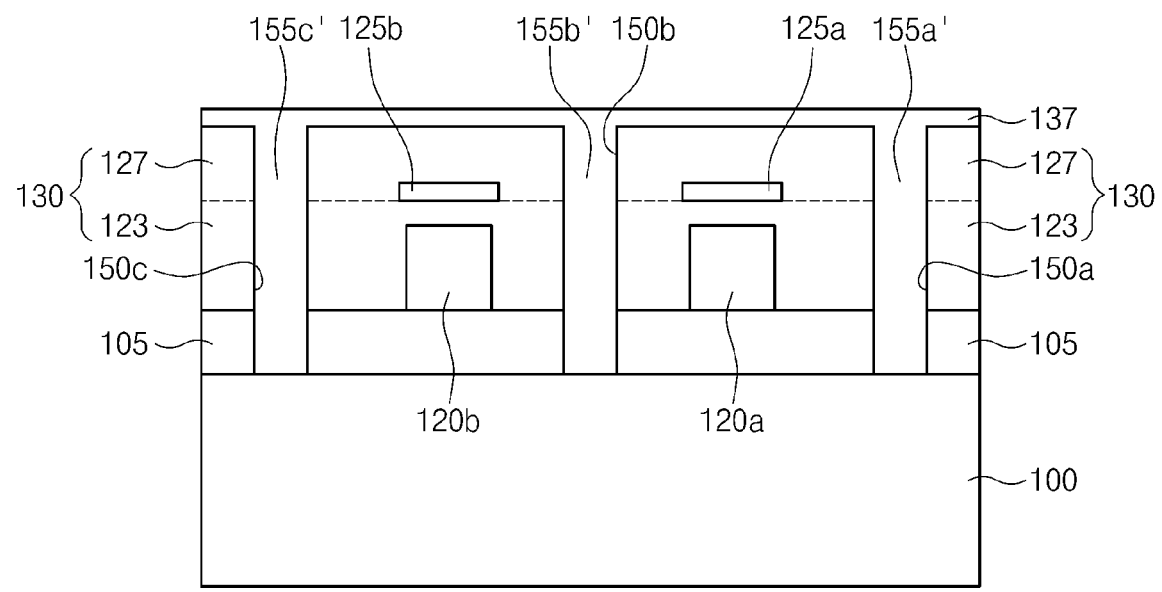

FIGS. 12A and 12B are cross-sectional views illustrating a method for forming the laser device of FIG. 5.

Referring to FIGS. 9A, 9B, 12A, and 12B, after forming the upper cladding layer 130, the first, second, and third trenches 150a, 150b, and 150c may be formed by sequentially patterning the upper and lower cladding layers 130 and 105 in the Bragg reflection region 95. The trenches 150a, 150b, and 150c may be formed after the ohmic layer 133 and the gain electrode 135 are formed. Alternatively, the trenches 150a, 150b, and 150c may be formed before the ohmic layer 133 and the gain electrode 135 are formed and after the upper cladding layer 130 is formed.

After the trenches 150a, 150b, and 150c are formed, the insulation layer 137 may be formed on an entire surface of the substrate 100. At this point, the insulation layer 137 may also be formed in the trenches 150a, 150b, and 150c. Portions of the insulation layer 137 in the trenches 150a, 150b, and 150c may correspond to the first, second, and third insulators 155a', 155b', and 155c', respectively.

Next, the active layer-micro heater 140a (see FIG. 1), the first micro heater 145a (see FIG. 1), and the second micro heater 145b (see FIG. 1) may be formed on the insulation layer 137, thereby realizing the laser device of FIG. 5.

According to the embodiments, the first and second micro heaters are coupled to the respective first and second diffraction gratings. Therefore, the first and/or second wavelengths of the first and/or second laser lights reflected and oscillated by the first and second diffraction gratings can continuously vary. Further, since the heat is supplied to the active layer by the active layer-micro heater, the gain curve of the active layer can vary. Accordingly, a difference between the intensities of outputted first and second laser lights can be minimized. As a result, the laser device having an excellent reliability can be realized. Furthermore, the first and second laser lights may provided to the photo-mixer via the oscillator and the like, such that a variable and stable terahertz wave can be generated.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A laser device comprising; a 1×2 splitter disposed on a substrate and having a stem core, a first twig core, and a second twig core; an active layer connected to the stem core, generating lights of a plurality of wavelengths and providing a gain for the lights; a first diffraction grating coupled to the first twig core; a second diffraction grating coupled to the second twig core; an active layer-micro heater supplying heat to the active layer; and a first micro heater and a second micro heater supplying heats to the first and second diffraction gratings, respectively; further comprising a first lower cladding layer between the active layer and the substrate; a first upper cladding layer on the active layer; a gain electrode electrically coupled to the first upper cladding layer; a second lower cladding layer between the 1×2 splitter and the substrate; and a second upper cladding layer on the 1×2 splitter.

2. The laser device of claim 1, wherein the active layer provides a spectral gain and the spectral gain varies by the heat from the active layer-micro heater.

3. The laser device of claim 2, wherein a refractive index of the first diffraction grating varies by the heat from the first micro heater; and a refractive index of the second diffraction grating varies by the heat from the second micro heater.

4. The laser device of claim 3, wherein the active layer-micro heater operates to supply the heat to the active layer while at least one of the first and second micro heaters operates to supply the heat.

5. The laser device of claim 1, wherein the 1×2 splitter is formed of a semiconductor material; the first and second lower cladding layers are formed of the same material as each other; and the first and second upper cladding layers are formed of the same material as each other.

6. The laser device of claim 1, wherein the 1.times.2 splitter is formed of polymer having a greater thermo optic coefficient than a semiconductor material; and the second lower cladding layer and the upper cladding layer are formed of polymer having a less refractive index than the 1.times.2 splitter.

7. The laser device of claim 6, wherein the first and second diffraction gratings are formed of polymer.

8. The laser device of claim 1, wherein the active layer-micro heater is disposed above the gain electrode; the first micro heater is disposed on the second upper cladding layer on the first twig core; and the second micro heater is disposed on the second upper cladding layer on the second twig core.

9. The laser device of claim 8, further comprising:
an insulation layer disposed between the active layer-micro heater and the gain electrode, between the first micro heater and the second upper cladding layer, and between the second micro heater and the second upper cladding layer.

10. The laser device of claim 1, further comprising:
a first thermal insulator, a second thermal insulator, and a third thermal insulator disposed on the substrate and spaced apart from each other in a lateral direction,
wherein the first twig core is disposed between the first and second thermal insulators and the second twig core is disposed between the second and third thermal insulators.

11. The laser device of claim 10, wherein the first, second, and third thermal insulators include at lease one of nitride and air.

12. The laser device of claim 1, wherein the first diffraction grating has a same grating period as a grating period of the second diffraction grating.

13. The laser device of claim 1, wherein the first diffraction grating has a different grating period from a grating period of the second diffraction grating.

14. The laser device of claim 1, wherein the active layer is formed in a multiple quantum well structure.

15. The laser device of claim 1, wherein the 1×2 splitter further comprises a taper core adjacent to the active layer, wherein the taper core has a first end contacting a first end of the active layer and a second end contacting the stem core, and a width of the taper core is gradually reduced from the stem core to the active layer.

* * * * *